(12) United States Patent
Kalburge et al.

(10) Patent No.: US 6,765,243 B1
(45) Date of Patent: Jul. 20, 2004

(54) HBT HAVING A CONTROLLED EMITTER WINDOW OPENING

(75) Inventors: Amol M. Kalburge, Irvine, CA (US); Kevin Q. Yin, Irvine, CA (US); Klaus F. Schuegraf, Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/265,334

(22) Filed: Oct. 4, 2002

Related U.S. Application Data

(62) Division of application No. 10/075,701, filed on Feb. 14, 2002, now Pat. No. 6,586,307.

(51) Int. Cl.[7] .............................................. H01L 29/737
(52) U.S. Cl. ....................................... 257/198; 257/588
(58) Field of Search ................................. 257/198, 588

(56) References Cited

U.S. PATENT DOCUMENTS 5,581,114 A * 12/1996 Bashir et al. ............... 257/588

6,482,710 B2 * 11/2002 Oda et al. ................... 438/311

* cited by examiner

Primary Examiner—Jerome Jackson
(74) Attorney, Agent, or Firm—Farjami & Farjami LLP

(57) ABSTRACT

According to one exemplary embodiment, a heterojunction bipolar transistor comprises a base having a top surface. The heterojunction bipolar transistor further comprises a first spacer and a second spacer situated on the top surface of the base. The heterojunction bipolar transistor further comprises an intermediate oxide layer situated on the first and second oxide spacers. The heterojunction bipolar transistor further comprises an amorphous layer situated on the intermediate oxide layer. The heterojunction bipolar transistor further comprises an antireflective coating layer on the amorphous layer. The heterojunction bipolar transistor further comprises an emitter window opening situated between the first and second spacers, where the emitter window opening is defined by the top surface of the base, the first and second spacers, the intermediate oxide layer, the amorphous layer, and the antireflective coating layer. The heterojunction bipolar transistor may further comprise an emitter situated in the emitter window opening.

12 Claims, 6 Drawing Sheets

HBT HAVING A CONTROLLED EMITTER WINDOW OPENING

This is a divisional of application Ser. No. 10/075,701 filed Feb. 14, 2002 now U.S. Pat. No. 6,586,307.

BACKGROUND OF THE INVENTION

1. Field of the Invention

The present invention relates to the field of fabrication of semiconductor devices. More specifically, the invention relates to fabrication of HBT semiconductor devices.

2. Background Art

In a heterojunction bipolar transistor, or HBT, a thin silicon-germanium ("SiGe") layer is grown as the base of a bipolar transistor on a silicon wafer. The SiGe HBT has significant advantages in speed, frequency response, and gain when compared to a conventional silicon bipolar transistor. Speed and frequency response can be compared by the cutoff frequency which, simply stated, is the frequency where the gain of a transistor is considerably reduced. Cutoff frequencies in excess of 100 GHz have been achieved for the HBT, which are comparable to the more expensive GaAs. Previously, silicon-only devices have not been competitive for use where very high speed and frequency response are required. The higher gain, speed and frequency response of the SiGe HBT are possible due to certain advantages of silicon-germanium, such as a narrower band gap and reduced resistivity. These advantages make silicon-germanium devices more competitive than silicon-only devices in areas of technology where high speed and high frequency response are required.

The advantages of high speed and high frequency response discussed above require, among other things, that certain dimensions, such as the width of an emitter structure in a self-aligned HBT, be very accurately controlled. The emitter width is a dimension that critically affects the performance of HBTs, and is considered a critical dimension, or "CD." A polycrystalline silicon emitter can be formed on the surface of a single crystal silicon-germanium base by several methods. For example, one method is to form a layer of some material which can be selectively etched to the single crystal silicon-germanium base to open a "window" in that material in which to deposit the polycrystalline silicon for the emitter. Thus, dimensional control of the emitter window opening is crucial in the formation of the emitter structure. Moreover, as device feature sizes become smaller, it becomes more difficult to accurately control the dimensions of features such as an emitter window opening. Conventional methods for creating the emitter window opening have proven less than satisfactory.

Control of feature dimensions of a silicon-germanium HBT is difficult because every step in the photolithographic patterning process contributes variations. For example, unwanted variation in dimension of a feature may be caused by defects in the photomask; reflectivity of a surface of the material below the photoresist, referred to as "subsurface reflectivity"; adhesion problems between an antireflective coating and the wafer and photomask; or poor matching of index of refraction between an antireflective coating and the photomask. Thus, as feature sizes become smaller, the CD budget becomes stricter, necessitating more accurate control over critical dimensions such as the width of the emitter window opening in a SiGe HBT. In the case of the SiGe NPN HBT, for example, control of the emitter window opening width is essential to the performance of the device.

Previous approaches to provide a practical, reliable method for accurately controlling feature dimensions of a silicon-germanium HBT, such as the formation of an emitter window opening, have met with various difficulties. For example, in one approach utilizing a double polysilicon process, an emitter window opening is formed in a $SiO_2$/poly stack. The double polysilicon process, however, is not compatible with SiGe technology. Another approach utilizing a selective epitaxy process results in poor manufacturing yield due to difficulties in controlling the selective epitaxy process. In yet another approach, a high-pressure oxide process has been utilized to provide accurate control of feature dimensions of a silicon-germanium HBT. However, the high-pressure oxide process requires specialized equipment and is not amenable to volume CMOS production.

A further approach to providing accurate control over feature dimensions of a silicon-germanium HBT utilizes a silicon oxide layer deposited over a sacrificial polysilicon emitter, which is situated between silicon oxide spacers. In the above approach, the silicon oxide layer and the sacificial polysilicon emitter are patterned and etched to form an emitter window opening between the silicon oxide spacers. However, in the above approach, manufacturing control of the resulting emitter window opening has been poor due to the photolithographic and etch properties of the silicon oxide layer.

Thus, there is a need in the art for accurate dimensional control of an emitter window opening in an HBT.

SUMMARY OF THE INVENTION

The present invention is directed to method for controlling an emitter window opening in an HBT and related structure. The present invention addresses and resolves the need in the art for accurate dimensional control of an emitter window opening in an HBT.

According to one exemplary embodiment, a heterojunction bipolar transistor comprises a base having a top surface. The heterojunction bipolar transistor, for example, may be an NPN silicon-germanium heterojunction bipolar transistor. The heterojunction bipolar transistor further comprises a first spacer and a second spacer situated on the top surface of the base. The first and second spacers, for example, may be silicon oxide. The heterojunction bipolar transistor further comprises an intermediate oxide layer situated on the first and second oxide spacers. For example, the intermediate oxide layer may be silicon oxide and may have a thickness of approximately 300.0 to 1000.0 Angstroms.

According to this exemplary embodiment, the heterojunction bipolar transistor further comprises an amorphous layer situated on the intermediate oxide layer. The amorphous layer may be, for example, amorphous silicon. The heterojunction bipolar transistor further comprises an antireflective coating layer on the amorphous layer. The antireflective coating layer may be, for example, an inorganic material such as silicon oxynitride.

According to this exemplary embodiment, the heterojunction bipolar transistor further comprises an emitter window opening situated between the first and second spacers, where the emitter window opening is defined by the top surface of the base, the first and second spacers, the intermediate oxide layer, the amorphous layer, and the antireflective coating layer. The heterojunction bipolar transistor may further comprise an emitter situated in the emitter window opening. The emitter, for example, may be a polycrystalline material, such as polycrystalline silicon. In another embodiment, the present invention is a method that achieves the above-described heterojunction bipolar transistor. Other features and advantages of the present invention will become more

DETAILED DESCRIPTION OF THE INVENTION

The present invention is directed to method for controlling an emitter window opening in an HBT and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
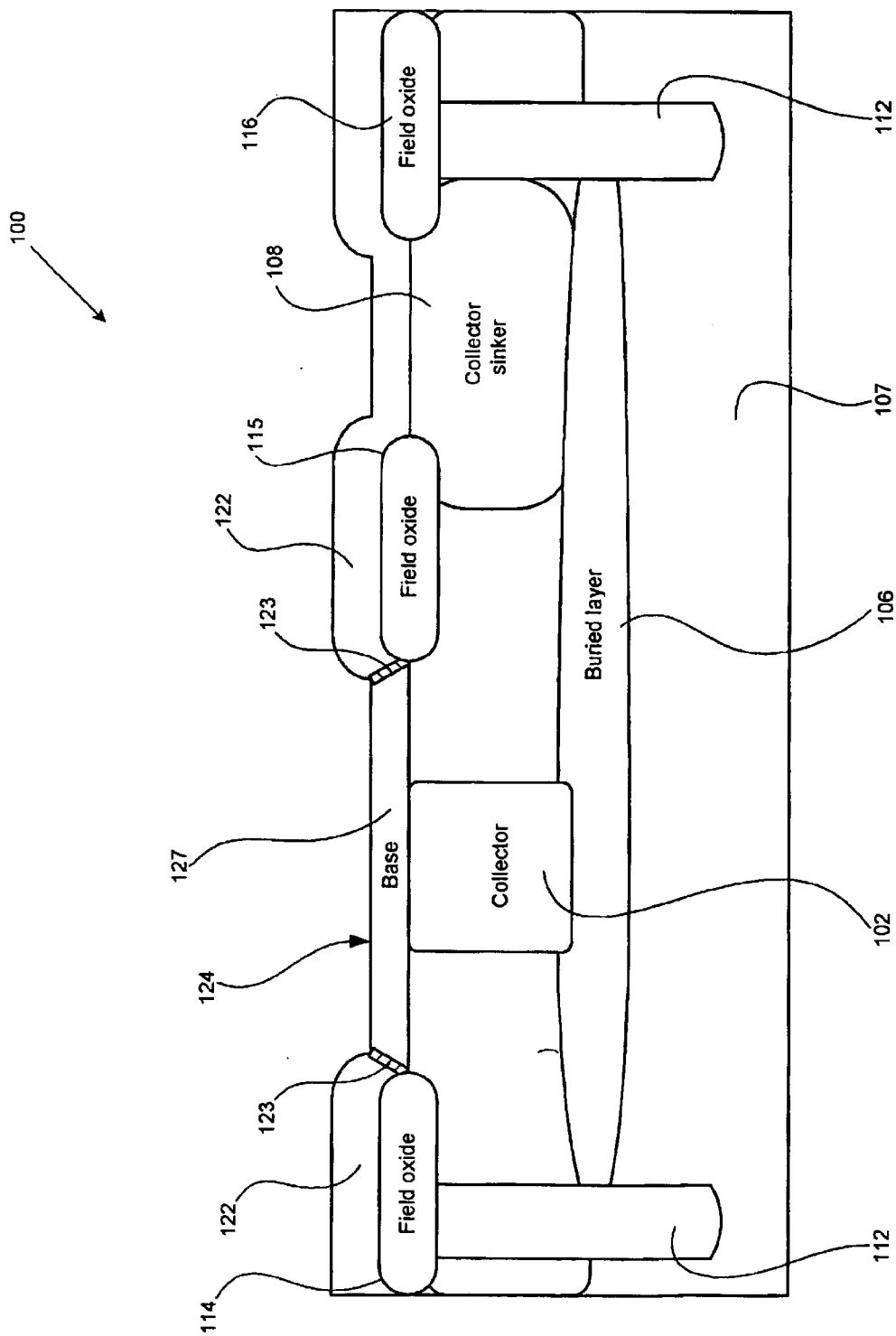
FIG. 1 illustrates a cross-sectional view of some of the features of an exemplary NPN HBT prior to application of the steps taken to implement an embodiment of the present invention.

FIG. 1 shows exemplary structure 100, which is utilized to describe an embodiment of the present invention. Certain details and features have been left out of FIG. 1, which are apparent to a person of ordinary skill in the art. Structure 100 includes collector 102 and base 127 for a SiGe heterojunction bipolar transistor ("HBT"). In the present embodiment, collector 102 is N-type single crystal silicon that can be formed using a dopant diffusion process in a manner known in the art. In the present embodiment, base 127 is P-type SiGe single crystal that might be deposited epitaxially in a LPCVD ("low pressure chemical vapor deposition") or a RPCVD ("reduced pressure chemical vapor deposition") process. Base 127 may be implanted with boron ions to achieve the aforementioned P-type doping. As seen in FIG. 1, base 127 is situated on top of, and forms a junction with, collector 102. In the present embodiment, base contact 122 is polycrystalline SiGe that may be deposited epitaxially in a LPCVD or a RPCVD process. Base 127 and base contact 122 connect with each other at interface 123 between the contact polycrystalline material and the base single crystal material. Base 127 has a top surface 124.

As seen in FIG. 1, buried layer 106, which is composed of N+ type material, i.e. it is relatively heavily doped N-type material, is formed in silicon substrate 107 in a manner known in the art. Collector sinker 108, also comprised of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in any of the Figures). Deep trenches 112 and field oxide isolation regions 114, 115, and 116 may be composed of silicon dioxide ($SiO_2$) material and are formed in a manner known in the art. Deep trenches 112 and field oxide isolation regions 114, 115, and 116 provide electrical isolation from other devices on silicon substrate 107 in a manner known in the art. Thus, FIG. 1 shows that structure 100 includes several features and components used to form an HBT at a stage prior to formation of an emitter comprised of N-type polycrystalline silicon above base 127.

Figure 2:
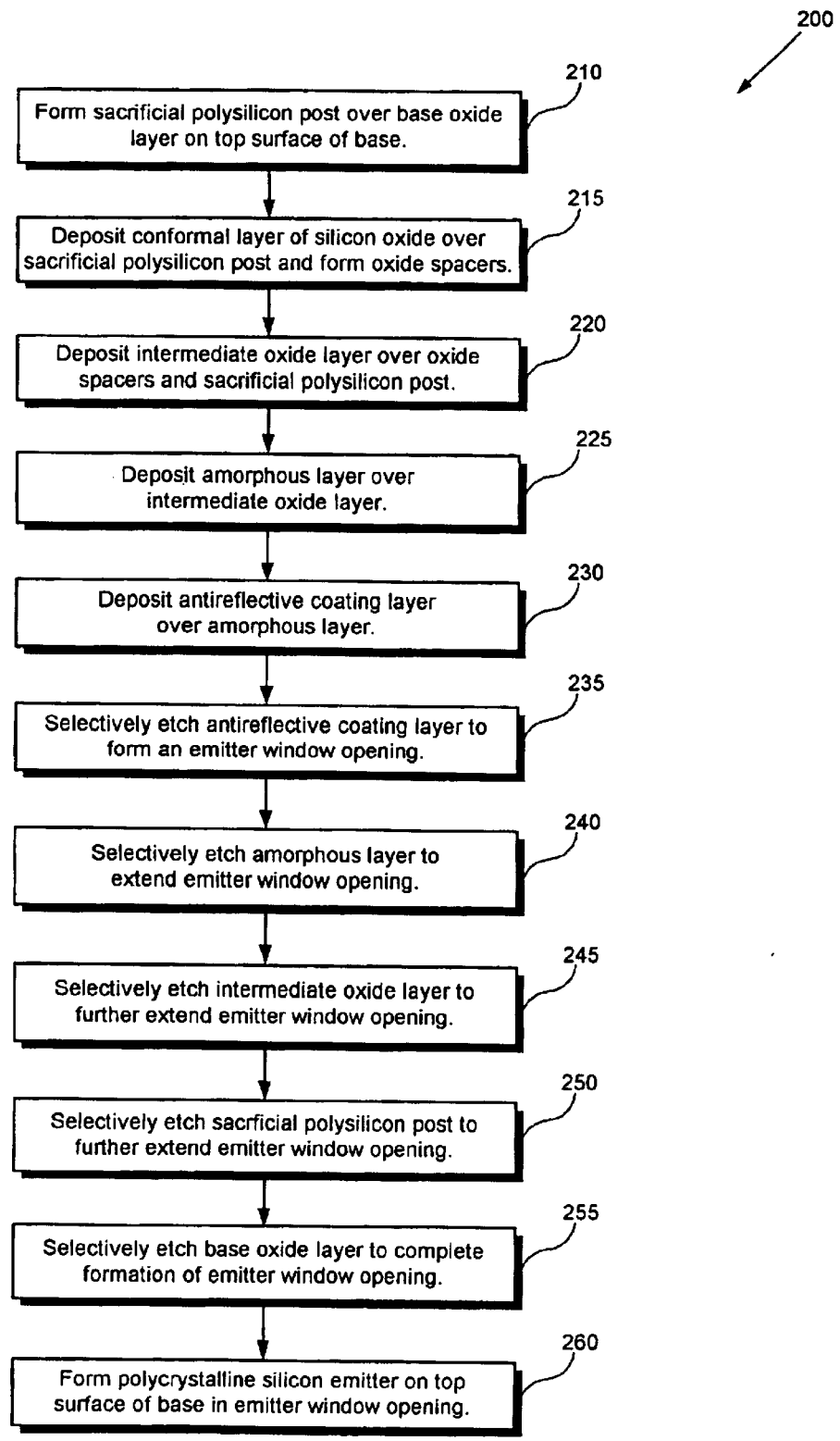
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100. Certain details and features have been left out of flowchart 200 that are apparent to a person of ordinary skill in the art. For example, a step may consist of one or more substeps or may involve specialized equipment or materials, as known in the art.

Steps 210 through 260 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 210, includes structure 100 shown in FIG. 1. In particular, the wafer includes top surface 124 of base 127 on which formation of an emitter comprised of N-type polycrystalline silicon is to take place in an "emitter window opening." Once the emitter has been deposited, it may have an "emitter width" substantially equal to the width of the emitter window opening.

Figure 3A:
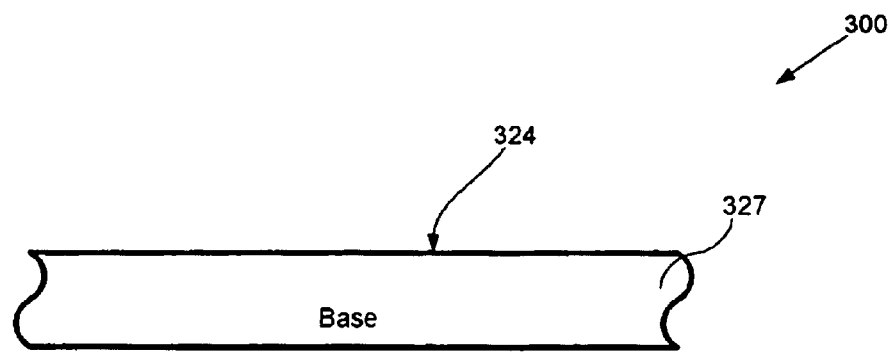
FIG. 3A illustrates cross-sectional views, which include portions of an HBT processed according to an embodiment of the invention, corresponding to certain steps of the flowchart in FIG. 2.
Figure 3A:
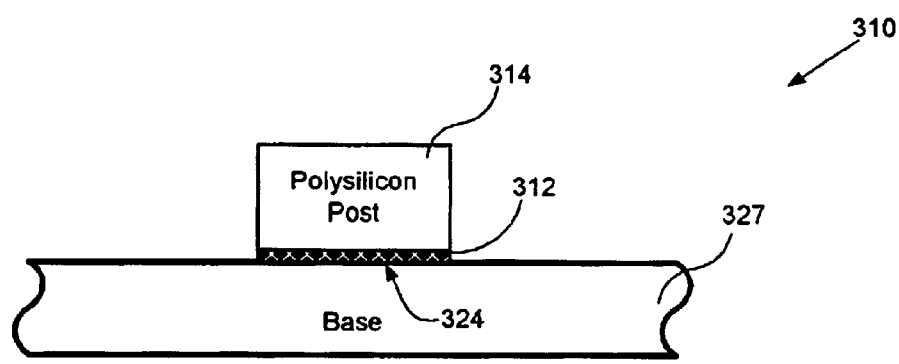
Figure 3A:
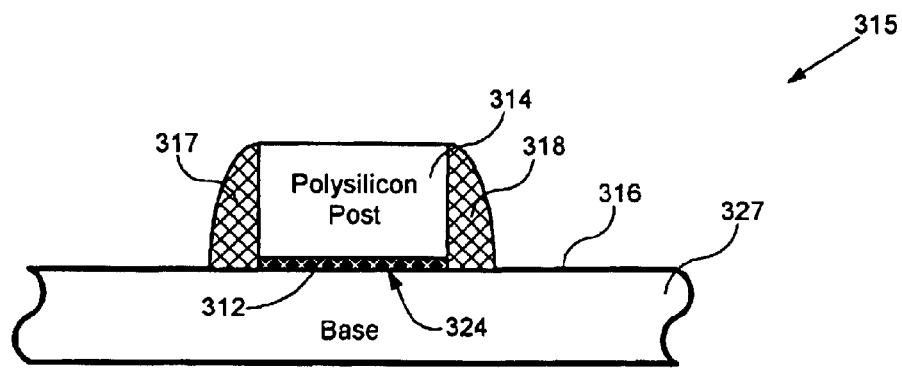

Referring now to FIG. 3A, structure 300 of FIG. 3A shows a portion of structure 100 of FIG. 1. Base 127 and top surface 124 of structure 100 are shown in structure 300 as base 327 and top surface 324, respectively. For simplicity, other features such as base contact 122, interface 123, collector 102, buried layer 106, silicon substrate 107, collector sinker 108, deep trenches 112, and field oxide regions 114, 115, and 116, are not shown in structure 300. Structure 300 thus shows the portion of a wafer including top surface 324 of base 327, on which the formation of an emitter comprised of N-type polycrystalline silicon is to take place in an emitter window opening, before processing the wafer according to one embodiment of the invention shown in flowchart 200 of FIG. 2. In particular, structure 300 shows a portion of the wafer before processing step 210 of flowchart 200.

Referring to FIGS. 3A, 3B, 3C, and 3D, structures 310, 315, 320, 325, 330, 335, 340, 345, 350, 355, and 360, illustrate the result of performing, on structure 300, steps 210, 215, 220, 225, 230, 235, 240, 245, and 250 of flowchart 200 of FIG. 2, respectively. For example, structure 310 shows structure 300 after processing step 210, structure 315 shows structure 310 after the processing of step 215, and so forth.

Continuing with step 210 in FIG. 2 and structure 310 in FIG. 3A, step 210 of flowchart 200 comprises the formation of a self-aligned sacrificial polysilicon post, i.e. sacrificial polysilicon post 314, over a silicon oxide (or "oxide") layer, i.e. base oxide layer 312, on top surface 324 of structure 300. Sacrificial polysilicon post 314 acts as a sacrificial emitter post that is removed before deposition of an emitter in a subsequent step. It is noted that silicon oxide is also referred to as "oxide" in the present application. Base oxide layer 312 may be formed by patterning and etching a layer of silicon oxide, which may be deposited in a LPCVD process at a temperature of approximately 650.0 to 700.0° C. or, alternatively, in a PECVD ("plasma enhanced chemical vapor deposition) process at a temperature of approximately 350 to 450° C., for example. In one embodiment, base oxide layer 312 has a thickness of approximately 100.0 Angstroms, and acts as an etch stop layer that provides control for a subsequent etch step. Sacrificial polysilicon post 314 may be formed by patterning and etching a layer of polysilicon, which may be deposited over base oxide layer 312 by chemical vapor deposition ("CVD"), as known in the art. The result of step 210 of flowchart 200 is illustrated by structure 310 in FIG. 3A.

Referring to step 215 in FIG. 2 and structure 315 in FIG. 3A, at step 215 of flowchart 200, a conformal layer of silicon oxide is deposited over polysilicon post 314. The deposited conformal layer of silicon oxide is etched back to form a pair of oxide spacers, i.e. oxide spacers 317 and 318. For example, oxide spacers 317 and 318 can be formed by anisotropically etching the conformal layer of silicon nitride using, for example, a chlorine based etchant. The anisotropic oxide etch is selective to sacrificial polysilicon post 314. In other words, the anisotropic oxide etch will not erode sacrificial polysilicon post 314. In the present embodiment, oxide spacers 317 and 318 may be formed from a layer of silicon oxide that is deposited in a LPCVD or a PECVD process. Referring to FIG. 3A, the result of step 215 of flowchart 200 is illustrated by structure 315.

Figure 3B:
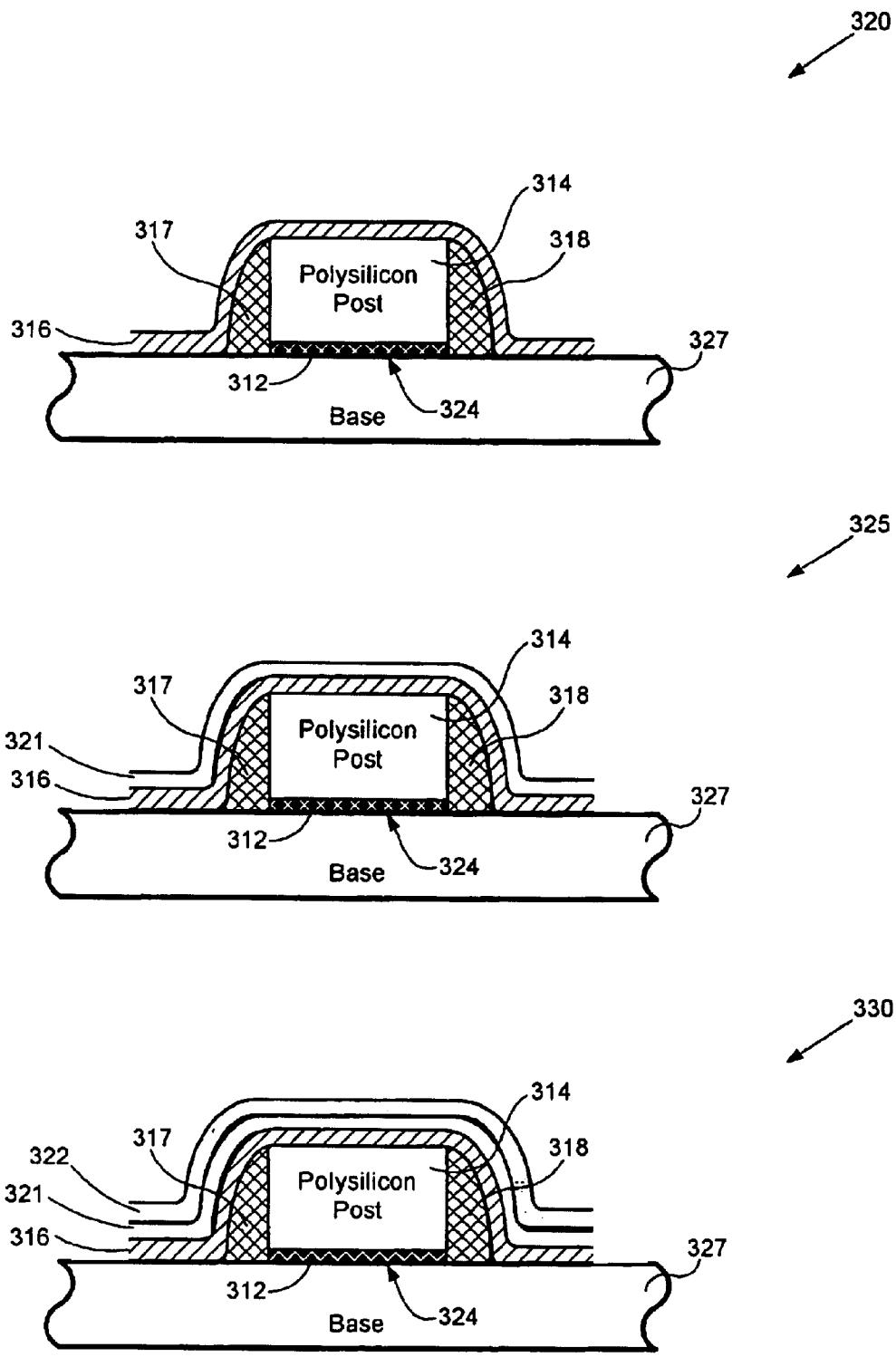
FIG. 3B illustrates cross-sectional views, which include portions of an HBT processed according to an embodiment of the invention, corresponding to certain steps of the flowchart in FIG. 2.

Continuing with step 220 in FIG. 2 and structure 320 in FIG. 3A, at step 220 of flowchart 200, a thin layer of silicon oxide, i.e. intermediate oxide layer 316, is conformally deposited over oxide spacers 317 and 318 and polysilicon post 314. In one embodiment, the thickness of intermediate oxide layer 316 may be approximately 300.0 to 1000.0 Angstroms. Referring to FIG. 3B, the result of step 220 of flowchart 200 is illustrated in FIG. 3B as structure 320.

Continuing with step 225 in FIG. 2 and structure 325 in FIG. 3B, at step 225, amorphous layer 321 is conformally deposited over intermediate oxide layer 316. Amorphous layer 321 may comprise amorphous silicon. In other embodiments, amorphous layer 321 may be replaced by a layer composed of polycrystalline silicon, amorphous SiGe, or amorphous silicon carbide. Referring to FIG. 3B, the result of step 225 of flowchart 200 is illustrated in FIG. 3B as structure 325.

Referring to step 230 in FIG. 2 and structure 330 in FIG. 3B, step 230 comprises conformally depositing antireflective coating ("ARC") layer 322 over amorphous layer 321. ARC layer 322 may comprise an inorganic material such as silicon oxynitride, for example. The addition of ARC layer 322 provides a number of functions, such as the reduction of "subsurface reflection," which degrades image definition of the photoresist by exposing portions of photoresist not intended to be exposed. Degradation of image definition is a factor in loss of dimensional control of features during photolithography. More specifically, ARC layer 322 provides enhanced photolithographic control over printing of an emitter window opening in a subsequent step. Referring to FIG. 3B, the result of step 230 of flowchart 200 is illustrated in structure 330.

Figure 3C:
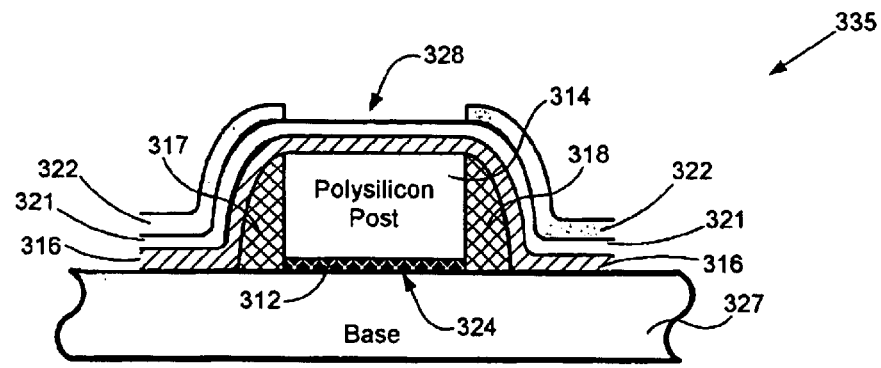
FIG. 3C illustrates cross-sectional views, which include portions of an HBT processed according to an embodiment of the invention, corresponding to certain steps of the flowchart in FIG. 2.
Figure 3C:
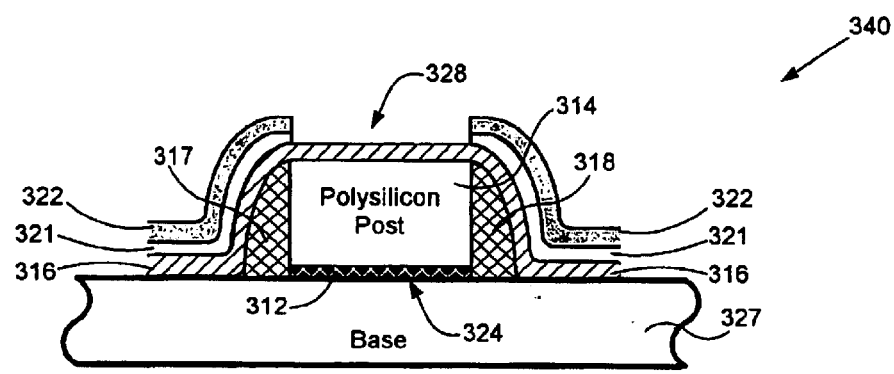
Figure 3C:
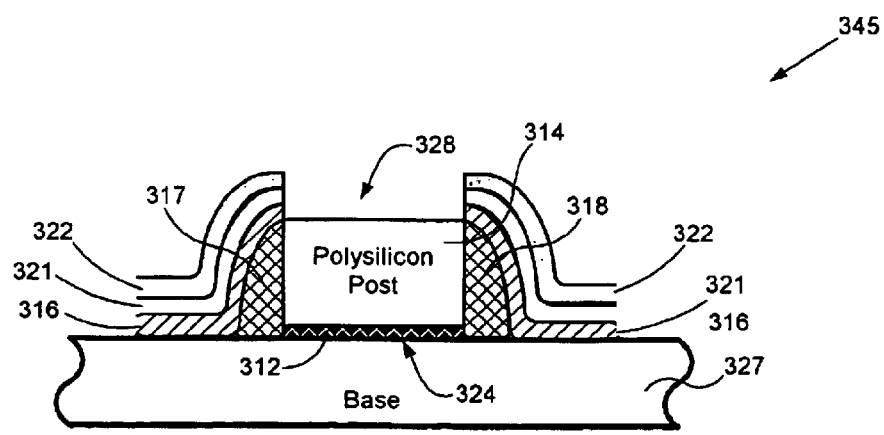

Continuing with step 235 in FIG. 2 and structure 335 in FIG. 3C, at step 235, emitter window opening 328 is formed by patterning and etching a target region of ARC layer 322 to expose amorphous layer 321. As described below, emitter window opening 328 is extended through a series of incremental, selective etching steps, which eventually terminate at top surface 324 of base 327. By utilizing a selective etch process as known in the art, only ARC layer 235 is etched, and amorphous layer 321 acts as an etch stop layer for the selective etch process. ARC layer 322 is a relatively thin layer, and as such, the etch time necessary to etch through ARC layer 322 is relatively short. Due to the short etch time, very little lateral etching or undercutting occurs during the etch of step 235, which allows the dimensions of emitter window opening 328 to be controlled with greater precision. Moreover, any subsequent material deposited in emitter window opening 328 will have dimensions that are better controlled. Referring to FIG. 3B, the result of step 235 of flowchart 200 is illustrated in structure 335.

Continuing with step 240 in FIG. 2 and structure 340 in FIG. 3C, at step 340 emitter window opening 328 is extended by selective etching of amorphous layer 321. During the selective etching of amorphous layer 321, intermediate oxide layer 316 acts as an etch stop layer. Amorphous layer 321 is a relatively thin layer, and as such, the etch time necessary to etch through amorphous layer 321 is relatively short. As a result of the short etch time, very little lateral etching or undercutting occurs during the etch of amorphous layer 321, which allows the dimensions of emitter window opening 328 to be controlled with greater precision. Moreover, any subsequent material deposited in. emitter window opening 328 will also have dimensions that are better controlled. Referring to FIG. 3C, the result of step 240 of flowchart 200 is illustrated in structure 340.

Continuing with step 245 in FIG. 2 and structure 345 in FIG. 3C, at step 245, intermediate oxide layer 316 is selectively etched in a manner known in the art to expose sacrificial polysilicon post 314, further extending emitter window opening 328. During the selective etch of intermediate oxide layer 316, sacrificial polysilicon post 314 acts as an etch stop layer. Intermediate oxide layer 316 is a relatively thin layer, and as such, the etch time necessary to etch through intermediate oxide layer 316 is relatively short. Due to the short etch time, very little lateral etching or undercutting occurs during the etch of step 245, which allows the dimensions of emitter window opening 328 to be controlled with greater precision. Referring to FIG. 3C, the result of step 245 of flowchart 200 is illustrated in structure 345.

Thus, by providing the combination of intermediate oxide layer 316, amorphous layer 321, and ARC layer 322, the present invention achieves a controlled, selective etch in steps 235, 240, and 245, respectively, thereby improving dimensional control of emitter window opening 328. Since intermediate oxide layer 316, amorphous layer 321, and ARC layer 322 are relatively thin films, and amorphous layer 321 acts as an etch stop for ARC layer 322 and intermediate oxide layer 316 acts as an etch stop for amorphous layer 321, a greater degree of dimensional control can be exercised over the formation of emitter window opening 328. Thus, by providing a greater degree of dimensional control over the formation of emitter window opening 328, the present invention advantageously achieves a more accurate emitter window opening having, for example, substantially vertical, uniform sidewalls. Moreover, as a result of greater dimensional control of emitter window opening 328, the present invention allows an emitter to be accurately and reliably formed in emitter window opening 328.

Figure 3D:
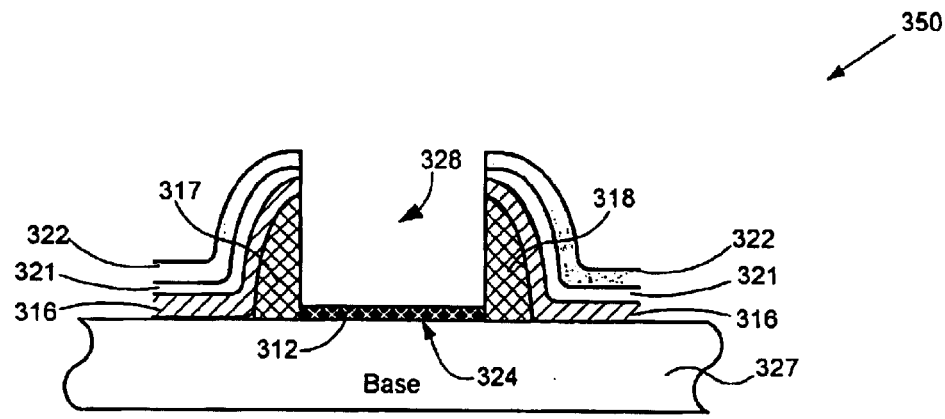
FIG. 3D illustrates cross-sectional views, which include portions of an HBT processed according to an embodiment of the invention, corresponding to certain steps of the flowchart in FIG. 2.
Figure 3D:
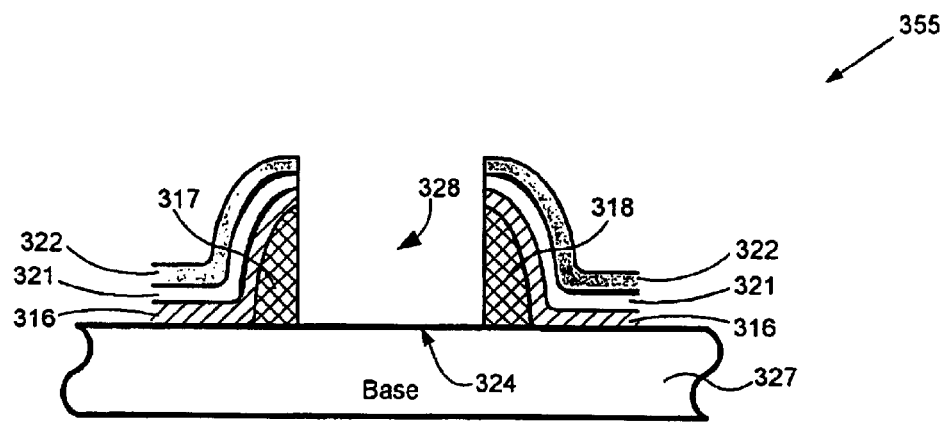
Figure 3D:
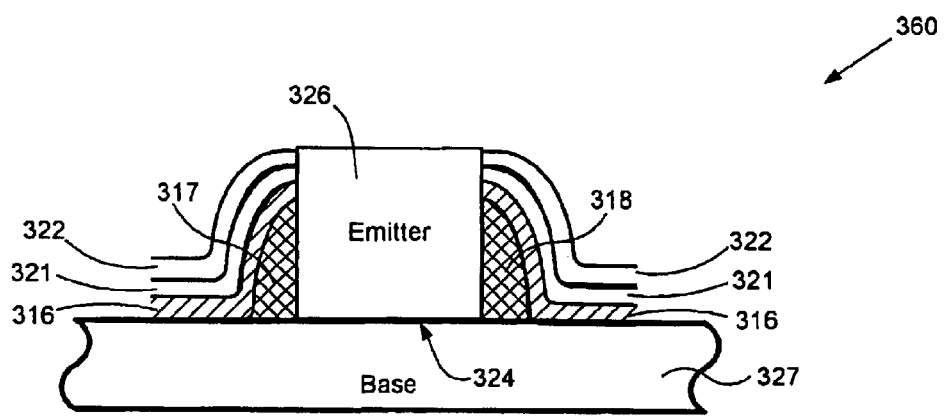

Continuing with step 250 in FIG. 2 and structure 350 in FIG. 3D, in step 250 sacrificial polysilicon post 314 is selectively etched in a manner known in the art, exposing base oxide layer 312, and further extending emitter window opening 328. During selective etching of sacrificial polysilicon post 314, the vertical sidewalls of oxide spacers 317 and 318 may be laterally etched. However, since base oxide layer 312 is a very thin layer, e.g. less than 100.0 Angstroms, the lateral etch into the sidewalls of oxide spacers 317 and 318 is minimal. Referring to FIG. 3C, the result of step 250 of flowchart 200 is illustrated in FIG. 3C as structure 350. Referring to FIG. 3D, the result of step 250 of flowchart 200 is illustrated in structure 350.

Continuing with step 255 in FIG. 2 and structure 355 in FIG. 3D, in step 255 base oxide layer 312 is selectively etched to expose top surface 324 of base 327. In the present embodiment, base oxide layer 312 may be etched, for example, by an HF wet etch. During the selective etch of base oxide layer 312, top surface 324 of base 327 provides an etch stop. Referring to FIG. 3D, the result of step 255 of flowchart 200 is illustrated in structure 355.

Continuing with step 260 in FIG. 2 and structure 360 in FIG. 3D, in step 260, emitter 326 is formed by depositing a polycrystalline material in emitter window opening 328 on top surface 324 between oxide spacers 317 and 318. In one embodiment, emitter 326 can comprise N-type polycrystalline silicon and can have a width substantially equal to emitter window opening 328. Referring to FIG. 3D, the result of step 260 of flowchart 200 is illustrated in structure 360.

In the present invention, emitter window opening 328 is accurately controlled at each etch step of flow chart 200, i.e. at steps 235, 240, 245, 250, and 255 of flowchart 200, as described above. Thus, the present invention achieves an emitter window opening, i.e. emitter window opening 328, which is accurately controlled and defined by top surface 324 of base 327, oxide spacers 317 and 318, intermediate oxide layer 316, amorphous layer 321, and ARC layer 322.

It is appreciated by the above detailed disclosure that the invention provides a method for formation of an HBT emitter window opening having dimensions that are accurately controlled. Although the invention is described as applied to the fabrication of a heterojunction bipolar transistor, it will be readily apparent to a person of ordinary skill in the art how to apply the invention in a similar situation where an accurately controlled window opening is required.

From the description of the above invention it is evident that various techniques can be used for implementing the concepts of the present invention without departing from its scope and spirit. Moreover, while the invention has been described with specific reference to certain embodiments, a person of ordinary skills in the art would recognize that changes made in form and detail without departing from the spirit and scope of the invention. For example, as stated above, amorphous layer 321 can be replaced with alternative layers comprised of polycrystalline silicon, amorphous SiGe, amorphous silicon carbide, or polycrystalline silicon carbide, without departing from the scope of the present invention.

The described embodiments are to be considered in all respects as illustrative and not restrictive. For example, although in the specific embodiment of the invention described above, emitter 326 was described as a polycrystalline emitter, it is possible to use an amorphous silicon emitter which is re-crystallized to form a polycrystalline silicon emitter. It is also possible to form a single crystal epitaxial emitter with an accurately controlled critical dimension in the manner described above. Moreover, the invention's teachings regarding controlling critical dimension can also be applied to control critical dimensions in contexts other than controlling the emitter window opening as specifically described in the present application. For example, the invention's teachings can be applied to achieve dimensional control for small features such as contact openings various semiconductor devices. Therefore, it should be understood that the invention is not limited to the particular embodiments described herein, but is capable of many rearrangements, modifications, and substitutions without departing from the scope of the invention.

Thus, method for controlling an emitter window opening in an HBT and related structure have been described.

What is claimed is:

1. A heterojunction bipolar transistor comprising:
   a base having a top surface;
   a first spacer and a second spacer situated on said top surface of said base;
   an intermediate oxide layer situated on said first and said second spacers;
   an amorphous layer situated on said intermediate oxide layer;
   an antireflective coating layer situated on said amorphous layer;
   an emitter window opening situated between said first spacer and said second spacer, said emitter window opening extending through said intermediate oxide layer, said amorphous layer, and said antireflective coating layer, said emitter window opening being defined by said first and said second spacers, said intermediate oxide layer, said amorphous layer, and said antireflective coating layer.

2. The heterojunction bipolar transistor of claim 1 wherein said first and second spacers comprise silicon oxide.

3. The heterojunction bipolar transistor of claim 1 further comprising an emitter situated in said emitter window opening.

4. The heterojunction bipolar transistor of claim 3 wherein said emitter comprises a polycrystalline material.

5. The heterojunction bipolar transistor of claim 1 wherein said intermediate oxide layer comprises silicon oxide.

6. The heterojunction bipolar transistor of claim 1 wherein a thickness of said intermediate oxide layer is approximately 300.0 to 1000.0 Angstroms.

7. The heterojunction bipolar transistor of claim 1 wherein said amorphous layer comprises amorphous silicon.

8. The heterojunction bipolar transistor of claim 1 wherein said antireflective coating layer comprises an inorganic material.

9. The heterojunction bipolar transistor of claim 1 wherein said antireflective coating layer comprises silicon oxynitride.

10. The heterojunction bipolar transistor of claim 3 wherein said emitter comprises polycrystalline silicon.

11. The heterojunction bipolar transistor of claim 1 wherein said heterojunction bipolar transistor is an NPN silicon-germanium heterojunction bipolar transistor.

12. A heterojunction bipolar transistor comprising:
   a base having a top surface;
   a first spacer and a second spacer situated on said top surface of said base;

an intermediate oxide layer situated on said first and said second spacers;

an amorphous layer situated on said intermediate oxide layer;

an antireflective coating layer situated on said amorphous layer, said antireflective coating layer comprising silicon oxynitride;

an emitter window opening situated between said first spacer and said second spacer, said emitter window opening being defined by said first and said second spacers, said intermediate oxide layer, said amorphous layer, and said antireflective coating layer.

* * * * *